(12) United States Patent
Do

(10) Patent No.: US 7,724,038 B2
(45) Date of Patent: May 25, 2010

(54) SEMICONDUCTOR DEVICE FOR RECEIVING EXTERNAL SIGNAL HAVING RECEIVING CIRCUIT USING INTERNAL REFERENCE VOLTAGE

(75) Inventor: Chang-Ho Do, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/164,174

(22) Filed: Jun. 30, 2008

(65) Prior Publication Data
US 2009/0273373 A1    Nov. 5, 2009

(30) Foreign Application Priority Data
Apr. 30, 2008    (KR) .................... 10-2008-0040903

(51) Int. Cl.
*H03K 5/22*    (2006.01)
(52) U.S. Cl. .................... 327/63; 327/65; 327/66; 327/72
(58) Field of Classification Search .................... 327/63, 327/65, 66, 72
See application file for complete search history.

(56) References Cited

U.S. PATENT DOCUMENTS

| 4,089,214 A | * | 5/1978 | Egami et al. | ............. 73/114.34 |
| 4,891,535 A | * | 1/1990 | Etheridge | .................... 326/73 |
| 5,850,157 A | * | 12/1998 | Zhu et al. | .................... 327/295 |
| 6,107,882 A | * | 8/2000 | Gabara et al. | ............... 330/253 |

FOREIGN PATENT DOCUMENTS

KR    1020030019083 A    3/2003

OTHER PUBLICATIONS

Notice of Preliminary Rejection issued from Korean Intellectual Property Office on May 27, 2009 with an English Translation.

\* cited by examiner

*Primary Examiner*—Kenneth B. Wells
(74) *Attorney, Agent, or Firm*—IP & T Law Firm PLC

(57) ABSTRACT

A semiconductor device includes a reference voltage generating unit configured to produce a reference voltage by dividing a voltage difference between a positive clock terminal and a negative clock terminal, and a logic determination unit configured to determine a logic level of an external signal based on the reference voltage.

12 Claims, 2 Drawing Sheets

US 7,724,038 B2

SEMICONDUCTOR DEVICE FOR RECEIVING EXTERNAL SIGNAL HAVING RECEIVING CIRCUIT USING INTERNAL REFERENCE VOLTAGE

CROSS-REFERENCE TO RELATED APPLICATION

The present invention claims priority of Korean patent application number 2008-0040903, filed on Apr. 30, 2008, which is incorporated by reference in its entirety.

BACKGROUND OF THE INVENTION

The present invention relates to a semiconductor design technology and, more particularly, to a circuit for receiving a signal to be input into a semiconductor device. Furthermore, the present invention relates to a circuit for receiving a signal to be input into a semiconductor device using a reference voltage which is produced in the semiconductor device.

Generally, in order to execute a predetermined internal operation in a semiconductor device, the semiconductor device needs various signals, such as clock signals, command signals, and data signals, supplied from an external circuit.

At this time, the external circuit transfers various signals to the semiconductor device via a transmission line which has an unspecified length and is made of an unspecified material because the signals are processed in signal processing units, such as a controller adjacent to the semiconductor device and an electric circuit which is directly controlled by a user.

That is, the signals can be distorted and deformed by various noise until the signals are input into the semiconductor device, regardless of the origination of the signals.

Accordingly, the semiconductor device includes a receiver to receive the various signals from an external circuit so that the signals normally can be used in the internal operation thereof.

FIG. 1 is a circuit diagram illustrating a conventional signal receiving circuit to receive a signal from an external circuit.

Referring to FIG. 1, the conventional signal receiving circuit, which receives signals CLK, CLKb and OUT_SIG supplied from an external circuit, has two methods for receiving the signals, even if they have slightly different configurations.

That is, the conventional signal receiving circuit, which receives signals CLK, CLKb and OUT_SIG supplied from the external circuit, includes a receiving circuit 100 to receive a positive clock signal CLK and a negative click signal CLKb and to output an internal clock signal iCLK and a receiving circuit 120 to receive an external signal OUT_SIG from an external circuit and to output an internal signal IN_SIG based on a potential level of a reference voltage VREF_IN supplied from the external circuit.

First, the receiving circuit 100 receives the positive and negative clock signals CLK and CLKb, which have the same frequency and are out of phase with each other, and includes a differential amplifier 102 to amplify a voltage difference between the positive clock signal CLK through a positive input terminal (+) and the negative clock signal CLKb through a negative input terminal (−), and a signal driving unit 104 to output an internal clock signal iCLK by driving a logic determination level according to an output signal from the differential amplifier 102.

The differential amplifier 102 includes first to third NMOS transistors N11 to N13 and first and second PMOS transistors P11 and P12. The first NMOS transistor N11 controls the amount of a current flowing from a drain-connected driving node DVND to a source-connected common node COMN in response to the positive clock signal CLK applied to this first NMOS transistor's gate. The second NMOS transistor N12 controls the amount of a current flowing from a drain-connected output node OUND to the source-connected common node COMN in response to the negative clock signal CLKb applied to this second NMOS transistor's gate. The first and second PMOS transistors P11 and P12 are coupled to each other in a current mirror type among a power supply voltage terminal VDD, the driving node DVND and the output node OUND in order to control an amount of current in such a manner that the amount of current flowing into the driving node DVND is the same as that flowing into the output node OUND. The third NMOS transistor N13 controls an amount of current flowing between the common node COMN and a ground voltage terminal VSS in response to an enable signal applied to a gate thereof.

The signal driving unit 104 includes a third PMOS transistor P13 and a fourth NMOS transistor N14. The third PMOS transistor P13 controls an amount of current flowing from a source-connected power supply voltage terminal VDD to a drain-connected driving node KND in response to a differential amplified voltage signal DFFER_AMP_VOL from the output node OUND of the differential amplifier 102. The fourth NMOS transistor N14 controls an amount of current flowing from a drain-connected driving node KND to a source-connected ground voltage terminal VSS in response to the differential amplified voltage signal DFFER_AMP_VOL from the output node OUND of the differential amplifier 102.

At this time, since the positive clock signal CLK is out of phase with the negative clock signal CLKb, it is easy to generate the internal clock signal iCLK by determining a voltage level through a receiving process in the receiving circuit 100, which receives the positive clock signal CLK and the negative clock signal CLKb, even if there is an unexpected distortion or deformity caused by a noise while the positive clock signal CLK and the negative clock signal CLKb are input into the receiving circuit 100.

That is, one of noise characteristics is that the simultaneously transferred signals have the same amount of noise. Since the positive clock signal CLK and the negative clock signal CLKb are simultaneously transferred, the positive clock signal CLK and the negative clock signal CLKb have the same distortion and deformity caused by the same noise effect in the receiving signals. Accordingly, although an unexpected noise has an effect on the positive clock signal CLK and the negative clock signal CLKb which are out of phase with each other, it is not possible to make the positive clock signal CLK changed into the negative clock signal CLKb.

Therefore, in the receiving circuit 100 to receive the positive clock signal CLK and the negative clock signal CLKb, it is easy to determine a voltage level of the internal clock signal iCLK using a voltage difference between the positive clock signal CLK and the negative clock signal CLKb and an accuracy of the voltage determination between the positive clock signal CLK and the negative clock signal CLKb is also high.

However, since the positive clock signal CLK and the negative clock signal CLKb are continuously toggled signals and they generally operate in high frequency, the positive clock signal CLK and the negative clock signal CLKb have to be controlled, in such a way that the positive clock signal CLK and the negative clock signal CLKb swing in a range of a CML region, for an effective signal transmission of the positive clock signal CLK and the negative clock signal CLKb.

At this time, the CML region means a common mode level. In the CML region, the maximum potential level VILmax is lower than the power supply voltage VDD and the minimum potential level VIHmin is higher than the ground voltage VSS.

That is, since it is not preferred, in terms of a current consumption, that the signals are continuously toggled in the high frequency, the current consumption of the transmission of the positive clock signal CLK and the negative clock signal CLKb has to be reduced maximally, by controlling the swing widths of the positive clock signal CLK and the negative clock signal CLKb and then making the swing widths of the positive clock signal CLK and the negative clock signal CLKb have relatively small values.

Furthermore, after the completion of the transmission of the positive clock signal CLK and the negative clock signal CLKb, the internal clock signal iCLK corresponding to the positive clock signal CLK and the negative clock signal CLKb has to be used in the semiconductor device without any problem, by controlling the swing widths of the positive clock signal CLK and the negative clock signal CLKb and then making the swing widths of the positive clock signal CLK and the negative clock signal CLKb have relatively large values.

Accordingly, in the receiving circuit 100 to receive the positive clock signal CLK and the negative clock signal CLKb, the internal clock signal iCLK is controlled in such a manner that the internal clock signal iCLK swing in a range of a CMOS region which is correspondent to clock edges of the positive clock signal CLK and the negative clock signal CLKb, by shifting the maximum potential level VILmax and the minimum potential level VIHmin to the power supply voltage VDD and the ground voltage VSS, respectively, through the receiving process of the positive clock signal CLK and the negative clock signal CLKb.

At this time, in the CMOS region, the maximum potential level VILmax is the same as the voltage level of the power supply voltage VDD and the minimum potential level VIHmin is the same as the voltage level of the ground voltage VSS. That is, the CMOS region means a full swing signal between the power supply voltage VDD and the ground voltage VSS.

A receiving circuit 120 receives an external signal OUT_SIG, which does not have a specific frequency, and includes a differential amplifier 122 and a signal driving unit 124. The differential amplifier 122, as a psudo differential amplifier, amplifies a voltage difference between a reference voltage VREDF_IN at a predetermined voltage level through a positive input terminal (+) and the external signal OUT_SIG through a negative input terminal (−). The signal driving unit 124 outputs an internal signal IN_SIG by driving a logic determination level according to an output signal from the differential amplifier 122.

For reference, the differential amplifier 122 included in the receiving circuit 120 to receive the external signal OUT_SIG has the same configuration as the differential amplifier 102 included in the receiving circuit 100 to receive the positive clock signal CLK and the negative clock signal CLKb. However, as mentioned above, the differential amplifier 122 is used as the psudo differential amplifier.

In more detail, in the differential amplifier 102 included in the receiving circuit 100 to receive the positive clock signal CLK and the negative clock signal CLKb, the positive clock signal CLK and the negative clock signal CLKb are out of phase with each other so that they are differential signals. Therefore, the differential amplifier 102 included in the receiving circuit 100 actually executes the differential amplification between the positive clock signal CLK and the negative clock signal CLKb.

However, since the external signal OUT_SIG and the reference signal VREF_IN are not 180° out of phase, the operation which is executed by the differential amplifier 122 included in the receiving circuit 120 is a comparison operation to compare the external signal OUT_SIG with the reference signal VREF_IN. Therefore, the differential amplifier 122 is called as "psudo differential amplifier" in the present invention.

The differential amplifier 122 of the receiving circuit 120 to receive the external signal OUT_SIG includes first to third NMOS transistors N15 to N17 and first and second PMOS transistors P14 and P15. The first NMOS transistor N15 controls an amount of current flowing from a drain-connected driving node DVND2 to a source-connected common node COMN2 in response to the reference signal VREF_IN applied to a gate thereof. The second NMOS transistor N16 controls an amount of current flowing from a drain-connected output node OUND2 to the source-connected common node COMN2 in response to the external signal OUT_SIG applied to a gate thereof. The first and second PMOS transistors P14 and P15 are coupled to each other in a current mirror type among a power supply voltage terminal VDD, the driving node DVND2 and the output node OUND2 in order to control an amount of current in such a manner that the amount of current flowing into the driving node DVND2 is the same as that flowing into the output node OUND2. The third NMOS transistor N17 controls an amount of current flowing between the common node COMN2 and a ground voltage terminal VSS in response to the enable signal applied to a gate thereof.

The signal driving unit 124 of the receiving circuit 120 to receive the external signal OUT_SIG includes a third PMOS transistor P16 and a fourth NMOS transistor N18. The third PMOS transistor P16 controls an amount of current flowing from a source-connected power supply voltage terminal VDD to a drain-connected driving node KND2 in response to a comparison signal COMP_VOL from the output node OUND2 of the differential amplifier 122. The fourth NMOS transistor N18 controls an amount of current flowing from a drain-connected driving node KND2 to a source-connected ground voltage terminal VSS in response to the comparison signal COMP_VOL from the output node OUND2 of the differential amplifier 122.

Since the external signal OUT_SIG applied to the receiving circuit 120 is a signal which is not known in its own signal type, the original value of the external signal OUT_SIG cannot be predicted while the external signal OUT_SIG is distorted or deformed through the signal transmission. It is not easy to determine an internal signal IN_SIG based on the external signal OUT_SIG in which the distortion or deformity is caused via the signal transmission.

Accordingly, in the conventional signal receiving circuit, the reference signal VREF_IN having a constant voltage level is input into the receiving circuit 120 with the external signal OUT_SIG in order to determine a voltage level of the internal signal IN_SIG which is correspondent to the external signal OUT_SIG.

That is, even if the external signal OUT_SIG is distorted or deformed by an unexpected noise, the internal signal IN_SIG can be in compliance with the external signal OUT_SIG based on a relatively exact value, by estimating a logic level of the external signal OUT_SIG based on the reference signal VREF_IN and then generating the internal signal IN_SIG.

However, as mentioned above, to implement the receiving circuit 120 to receive the external signal OUT_SIG, the reference signal VREF_IN is additionally and inevitably used with the external signal OUT_SIG.

That is, since the reference signal VREF_IN has to be used with the external signal OUT_SIG, an additional dedicated pad for receiving the reference signal VREF_IN has to be provided together with a dedicated pad for receiving the external signal OUT_SIG.

At this time, although only one dedicated pad for receiving the reference signal VREF_IN is shown in FIG. 1, a member of dedicated pads can be required to comply with various functions of the semiconductor devices and this large number of dedicated pads increase the development cost with the tendency of high integration in semiconductor modules.

When the signal receiving circuit to receive a signal from an external circuit is applied to a synchronous memory such as a SDRAM (Synchronous Dynamic Random Access Memory), a synchronization unit 160 can be further included in the signal receiving circuit. The synchronization unit 160 synchronizes the internal clock signal iCLK, which is output as a result of the receiving circuit 100 to receive the positive clock signal CLK and the negative clock signal CLKb, with the internal signal IN_SIG, which is output as a result of the receiving circuit 120 to receive the external signal OUT_SIG.

In this case, if the maximum and minimum potential levels VILmax and VIHmin of the positive and negative clock signals CLK and CLKb is varied according to the external environment of the semiconductor device but the potential level of the reference voltage VREF_IN is not varied, the activation and inactivation sections of the internal clock signal ICLK which is produced by receiving the positive clock signal CLK and the negative clock signal CLKb are varied but the activation and inactivation sections of the internal signal IN_CLK which is produced by receiving the external signal OUT_SIG based on the reference voltage VREF_IN are not varied. Therefore, there is a problem in that the set up and hold time characteristics of the synchronized internal signal SYNC_IN_SIG are changed in the synchronization unit 160.

For example, when the maximum and minimum potential levels VILmax and VIHmin of the positive and negative clock signals CLK and CLKb are generally increased, the receiving circuit 100 to receive the positive and negative clock signals CLK and CLKb produces the internal clock signal iCLK at a high speed more than usual. However, since the potential level of the reference voltage VREDF_IN is not varied, the receiving circuit 120 to receive the external signal OUT_SIG produces the internal signal IN_SIG without a change of the operation speed. If the synchronization of the internal clock signal iCLK and the internal signal IN_SIG, which are changed with a different timing, is carried out in the synchronization unit 160, the synchronized internal signal SYNC_IN_SIG is output with a change of the set up and hold time characteristics.

On the contrary, if the maximum and minimum potential levels VILmax and VIHmin of the positive and negative clock signals CLK and CLKb is not varied but the potential level of the reference voltage VREF_IN is varied according to the external environment of the semiconductor device, the activation and inactivation sections of the internal clock signal iCLK which is produced by receiving the positive clock signal CLK and the negative clock signal CLKb are varied but the activation and inactivation sections of the internal signal IN_CLK which is produced by receiving the external signal OUT_SIG based on the reference voltage VREF_IN are varied. Therefore, there is a problem in that the set up and hold time characteristics of the synchronized internal signal SYNC_IN_SIG are changed in the synchronization unit 160.

When the signal receiving circuit is actually used in the semiconductor device, the variation of the reference voltage VREF_IN in the potential level or the variation of the positive and negative clock signals CLK and CLKb in the maximum and minimum potential levels VILmax and VIHmin can be caused due to the various environments, even though some cases are mentioned above. Therefore, the set up and hold time characteristics of the synchronized internal signal SYNC_IN_SIG can be frequently changed in the synchronization unit.

As mentioned above, when the set up and hold time characteristics of the synchronized internal signal SYNC_IN_SIG is changed, other circuits (not shown) in the semiconductor device which operate based on this set up and hold time characteristics undergo the fluctuation in the operation timing. As a result, the semiconductor device cannot execute a predetermined normal operation.

SUMMARY OF THE INVENTION

Embodiments of the present invention are directed to providing a signal receiving circuit for generating a reference voltage using differential clock signals, which are toggled with out-of-phase signals, and receiving an external signal using the produced reference voltage.

In accordance with an aspect of the present invention, there is provided a semiconductor device including: a reference voltage generating unit configured to produce a reference voltage by dividing a voltage difference between a positive clock terminal and a negative clock terminal; and a logic determination unit configured to determine a logic level of an external signal based on the reference voltage.

In accordance with another aspect of the present invention, there is provided a semiconductor device including: a clock receiving unit configured to receive positive and negative clock signals and output an internal clock signal based on the received positive and negative clock signals; a reference voltage generating unit configured to produce a reference voltage by dividing a voltage difference between the positive and negative clock signals; an input signal receiving unit configured to receive an external signal from an external circuit using the reference voltage; and a synchronization unit configured to synchronize an output signal of the input signal receiving unit with the internal clock signal.

The present invention does not need a reference voltage supplied from an external circuit, by internally generating a reference voltage within a semiconductor device using differential clock signals which are toggled with out-of-phase signals.

Therefore, the semiconductor device according to the present invention can flexibly change a voltage level of the reference voltage so that the external signal can be more stably received to the signal receiving circuit.

DESCRIPTION OF SPECIFIC EMBODIMENTS

Hereinafter, a semiconductor memory device in accordance with the present invention will be described in detail referring to the accompanying drawings.

Figure 2:
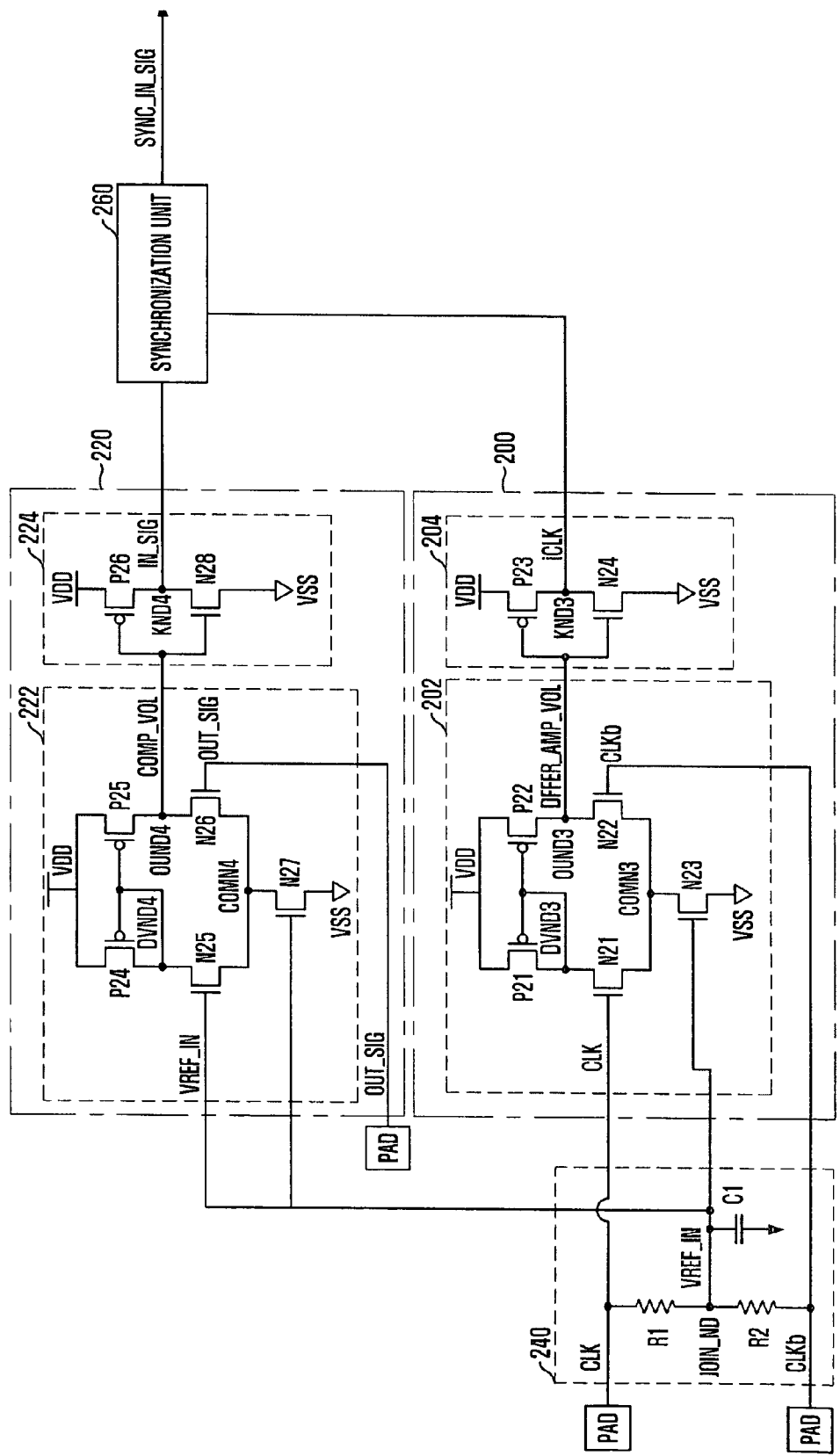
FIG. 2 is a circuit diagram illustrating a signal receiving circuit to receive a signal from an external circuit according to one embodiment of the present invention.

FIG. 2 is a circuit diagram illustrating a signal receiving circuit to receive a signal from an external circuit according to one embodiment of the present invention.

Figure 1:
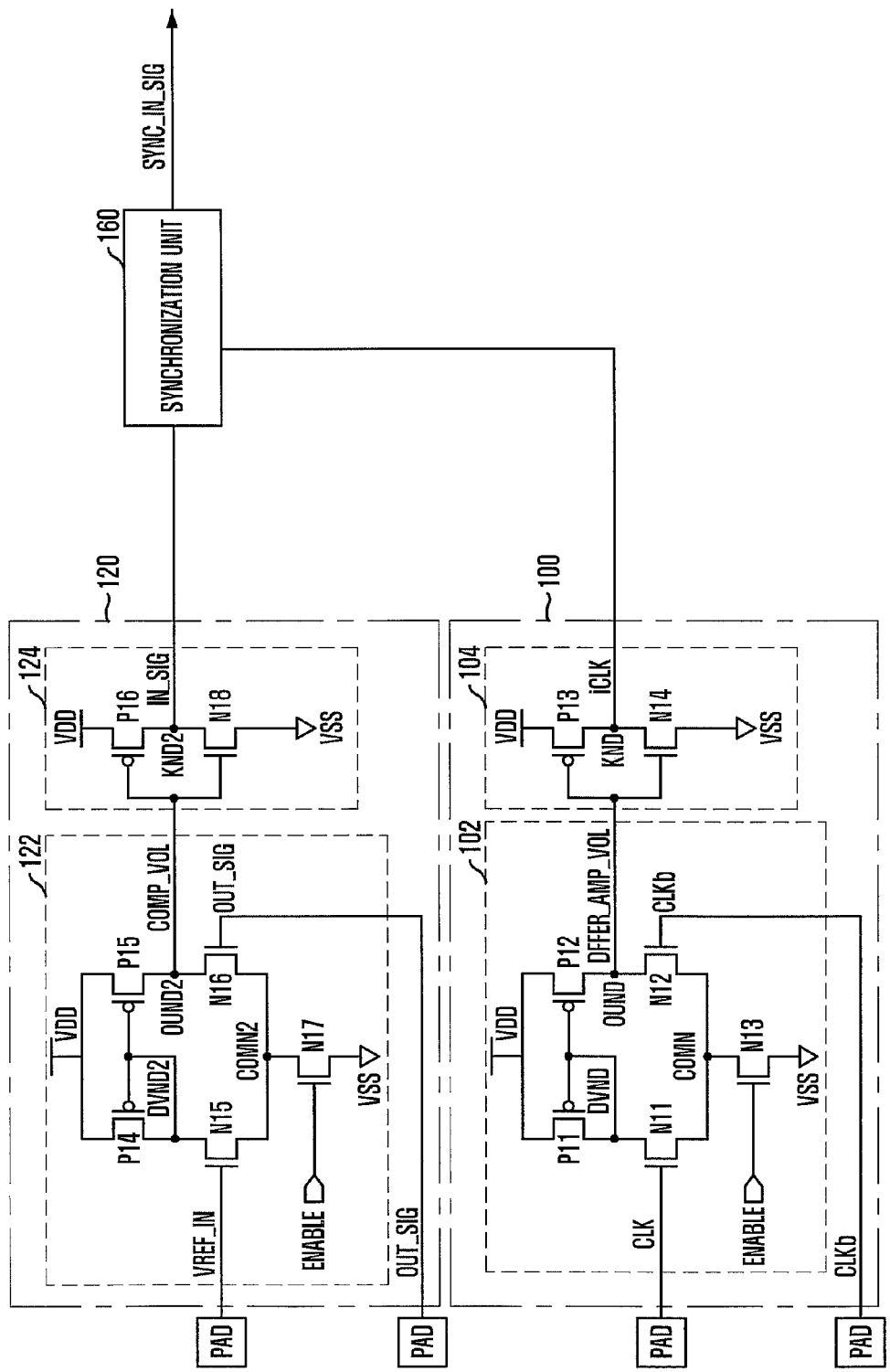
FIG. 1 is a circuit diagram illustrating a conventional signal receiving circuit to receive a signal from an external circuit.

Referring to FIG. 2, the signal receiving circuit according to one embodiment of the present invention, which receives signals CLK, CLKb and OUT_SIG supplied from an external circuit, has a structure similar to the signal receiving circuit illustrated in FIG. 1 except that it is configured to use a different method for receiving the signals.

That is, the signal receiving circuit, which receives signals CLK, CLKb and OUT_SIG supplied from the external circuit, includes a receiving circuit 200 to receive a positive clock signal CLK and a negative click signal CLKb and to output an internal clock signal iCLK and a receiving circuit 220 to receive an external signal OUT_SIG from the external circuit and to output an internal signal IN_SIG based on a potential level of a reference voltage VREF_IN supplied from an internal circuit.

Furthermore, being different from the signal receiving circuit illustrated in FIG. 1, the signal receiving circuit according to one embodiment of the present invention further includes a reference voltage generating unit 240 to generate a reference voltage VREF_IN for receiving the signals CLK, CLKb and OUT_SIG supplied from the external circuit.

In more detail, as compared with the conventional signal receiving circuit, the signal receiving circuit according to one embodiment of the present invention additionally includes the reference voltage generating unit 240 which generates the reference voltage VREF_IN by dividing a voltage difference between the positive clock signal CLK and the negative clock signal CLKb at a predetermined rate.

The reference voltage generating unit 240 includes a first resistor R1 and a second resistor R2 which are in series connected to each other between two input terminals of the positive clock signal CLK and the negative clock signal CLKb. The reference voltage VREF_IN is produced through a connection node between the first and second resistors R1 and R2.

At this time, since the positive clock signal CLK is out of phase with the negative clock signal CLKb, a voltage level of the reference voltage VREF_IN may be a half of the voltage difference between the maximum and minimum potential levels VILmax and VIHmin of the positive and negative clock signals CLK and CLKb, by setting up the first and second resistors R1 and R2 with the same resistance values. However, the different resistance values can be set up for the first and second resistors R1 and R2 by a circuit designer.

A capacitor C1 having a predetermined capacitance is further provided between two terminals of the reference voltage VREF_IN and a ground voltage VSS.

The capacitor C1 is used to prevent the potential level of the reference voltage VREF_IN from being fluctuated by a noise.

That is, since the positive clock signal CLK and the negative clock signal CLKb which are used for generating the reference voltage VREF_IN are under the influence of the noise which is caused during the signal transmission, there can be a minute fluctuation in the voltage level of the positive clock signal CLK and the negative clock signal CLKb because of the noise. Meanwhile, since the reference voltage VREF_IN is produced by dividing the positive clock signal CLK and the negative clock signal CLKb, there can be a minute fluctuation in the voltage level of the reference voltage VREF_IN.

However, if the capacitor C1 is provided to the output terminal of the reference voltage VREF_IN, the capacitor C1 can provide a stable voltage level by filtering the minute fluctuation in the reference voltage VREF_IN.

The receiving circuit 200 receives the positive and negative clock signals CLK and CLKb, which have the same frequency and are out of phase with each other, and includes a differential amplifier 202 to amplify a voltage difference between the positive clock signal CLK through a positive input terminal (+) and the negative clock signal CLKb through a negative input terminal (−), and a signal driving unit 204 to output an internal clock signal iCLK by driving a logic determination level according to an output signal from the differential amplifier 202.

The differential amplifier 202 includes first to third NMOS transistors N22 to N23 and first and second PMOS transistors P21 and P22. The first NMOS transistor N221 controls an amount of current flowing from a drain-connected driving node DVND3 to a source-connected common node COMN3 in response to the positive clock signal CLK applied to a gate thereof. The second NMOS transistor N22 controls an amount of current flowing from a drain-connected output node OUND3 to the source-connected common node COMN3 in response to the negative clock signal CLKb applied to a gate thereof. The first and second PMOS transistors P21 and P22 are coupled to each other in a current mirror type among a power supply voltage terminal VDD, the driving node DVND3 and the output node OUND3 in order to control an amount of current in such a manner that the amount of current flowing into the driving node DVND3 is the same as that flowing into the output node OUND3. The third NMOS transistor N23 controls an amount of current flowing between the common node COMN3 and a ground voltage terminal VSS in response to the voltage level of the reference voltage VREF_IN applied to a gate thereof.

The signal driving unit 204 includes a third PMOS transistor P23 and a fourth NMOS transistor N24. The third PMOS transistor P23 controls an amount of current flowing from a source-connected power supply voltage terminal VDD to a drain-connected driving node KND3 in response to a differential amplified voltage signal DFFER_AMP_VOL from the output node OUND3 of the differential amplifier 202. The fourth NMOS transistor N24 controls an amount of current flowing from a drain-connected driving node KND3 to a source-connected ground voltage terminal VSS in response to the differential amplified voltage signal DFFER_AMP_VOL from the output node OUND3 of the differential amplifier 202.

At this time, since the positive clock signal CLK is out of phase with the negative clock signal CLKb, it is easy to generate the internal clock signal iCLK by determining a voltage level through a receiving process, even if there is an unexpected distortion or deformity caused by a noise while the positive clock signal CLK and the negative clock signal CLKb are input into the receiving circuit 200.

That is, one of noise characteristics is that the simultaneously transferred signals have the same amount of noise. Since the positive clock signal CLK and the negative clock signal CLKb are simultaneously transferred, the positive clock signal CLK and the negative clock signal CLKb have the same distortion and deformity caused by the same noise effect in the receiving signals. Accordingly, although an unexpected noise has an effect on the positive clock signal CLK and the negative clock signal CLKb which are out of phase with each other, it is not possible to make the positive clock signal CLK changed into the negative clock signal CLKb.

Therefore, in the receiving circuit 200 to receive the positive clock signal CLK and the negative clock signal CLKb, it is easy to determine a voltage level of the internal clock signal iCLK using a voltage difference between the positive clock signal CLK and the negative clock signal CLKb and an accuracy of the voltage determination between the positive clock signal CLK and the negative clock signal CLKb is also high.

However, since the positive clock signal CLK and the negative clock signal CLKb are continuously toggled signals and they generally operate in high frequency, the positive clock signal CLK and the negative clock signal CLKb have to be controlled, in such a way that the positive clock signal CLK and the negative clock signal CLKb swing in a range of a CML region, for an effective signal transmission of the positive clock signal CLK and the negative clock signal CLKb.

At this time, the CML region means a common mode level. In the CML region, the maximum potential level VILmax is lower than the power supply voltage VDD and the minimum potential level VIHmin is higher than the ground voltage VSS.

That is, since it is not preferred, in terms of a current consumption, that the signals are continuously toggled in the high frequency, the current consumption of the transmission of the positive clock signal CLK and the negative clock signal CLKb has to be reduced maximally by controlling the swing widths of the positive clock signal CLK and the negative clock signal CLKb and then making the swing widths of the positive clock signal CLK and the negative clock signal CLKb have relatively small values.

Furthermore, after the completion of the transmission of the positive clock signal CLK and the negative clock signal CLKb, the internal clock signal iCLK corresponding to the positive clock signal CLK and the negative clock signal CLKb has to be used in the semiconductor device without any problem, by controlling the swing widths of the positive clock signal CLK and the negative clock signal CLKb and then making the swing widths of the positive clock signal CLK and the negative clock signal CLKb have relatively large values.

Accordingly, in the receiving circuit 200 to receive the positive clock signal CLK and the negative clock signal CLKb, the internal clock signal iCLK is controlled in such a manner that the internal clock signal iCLK swing in a range of a CMOS region which is correspondent to clock edges of the positive clock signal CLK and the negative clock signal CLKb, by shifting the maximum potential level VILmax and the minimum potential level VIHmin to the power supply voltage VDD and the ground voltage VSS, respectively, through the receiving process of the positive clock signal CLK and the negative clock signal CLKb.

At this time, in the CMOS region, the maximum potential level VILmax is the same as the voltage level of the power supply voltage VDD and the minimum potential level VIHmin is the same as the voltage level of the ground voltage VSS. That is, the CMOS region means a full swing signal between the power supply voltage VDD and the ground voltage VSS.

As mentioned above, there is a difference between the receiving circuit 200 to receive the positive clock signal CLK and the negative clock signal CLKb of FIG. 2 and the receiving circuit 100 to receive the positive clock signal CLK and the negative clock signal CLKb of FIG. 1. Namely, the differential amplifier 102 of the receiving circuit 100 is controlled in response to the enable ENABLE; however, the differential amplifier 202 of the receiving circuit 200 according to the present invention is controlled in response to the reference voltage signal VREF_IN.

The reference voltage VREF_IN is used, instead of the enable signal ENABLE, in the receiving circuit 200 to receive the positive clock signal CLK and the negative clock signal CLKb in order that the receiving circuit 200, which receives the positive clock signal CLK and the negative clock signal CLKb, and the receiving circuit 220, which receives the external signal OUT_SIG, have the same timing based on the reference voltage VREF_IN, but not in order that the operation of the receiving circuit 200, which receives the positive clock signal CLK and the negative clock signal CLKb, is considerably changed as compared with the conventional receiving circuit.

As a result, the operation of the receiving circuit 200, which receives the positive clock signal CLK and the negative clock signal CLKb, is not any different from that of the receiving circuit 100, which receives the positive clock signal CLK and the negative clock signal CLKb, in FIG. 1.

A receiving circuit 220 receives an external signal OUT_SIG, which does not have a specific frequency, and includes a differential amplifier 222 and a signal driving unit 224. The differential amplifier 222, as a psudo differential amplifier, amplifies a voltage difference between the reference voltage VREDF_IN output from the reference voltage generating unit 240 through a positive input terminal (+) and the external signal OUT_SIG through a negative input terminal (−). The signal driving unit 224 outputs an internal signal IN_SIG by driving a logic determination level according to an output signal from the differential amplifier 222.

For reference, the differential amplifier 222 included in the receiving circuit 220 to receive the external signal OUT_SIG has the same configuration as the differential amplifier 202 included in the receiving circuit 200 to receive the positive clock signal CLK and the negative clock signal CLKb. However, as mentioned above, the differential amplifier 222 is used as the psudo differential amplifier.

In more detail, in the differential amplifier 202 included in the receiving circuit 200 to receive the positive clock signal CLK and the negative clock signal CLKb, the positive clock signal CLK and the negative clock signal CLKb are out of phase with each other so that they are differential signals. Therefore, the differential amplifier 202 included in the receiving circuit 200 actually executes the differential amplification between the positive clock signal CLK and the negative clock signal CLKb.

However, since the external signal OUT_SIG and the reference signal VREF_IN are not 180° out of phase, the operation which is executed by the differential amplifier 222 included in the receiving circuit 220 is a comparison operation to compare the external signal OUT_SIG with the reference signal VREF_IN. Therefore, the differential amplifier 222 is called as "psudo differential amplifier" in the present invention.

The differential amplifier 222 of the receiving circuit 220 to receive the external signal OUT_SIG includes first to third NMOS transistors N25 to N27 and first and second PMOS transistors P24 and P25. The first NMOS transistor N25 controls an amount of current flowing from a drain-connected driving node DVND4 to a source-connected common node COMN4 in response to the reference signal VREF_IN applied to a gate thereof. The second NMOS transistor N26 controls an amount of current flowing from a drain-connected output node OUND4 to the source-connected common node COMN4 in response to the external signal OUT_SIG applied to a gate thereof. The first and second PMOS transistors P24 and P25 are coupled to each other in a current mirror type among a power supply voltage terminal VDD, the driving node DVND4 and the output node OUND4 in order to control an amount of current in such a manner that the amount of current flowing into the driving node DVND4 is the same as that flowing into the output node OUND4. The third NMOS transistor N27 controls an amount of current flowing between the common node COMN4 and a ground voltage terminal VSS in response to the reference voltage VREF_IN applied to a gate thereof.

The signal driving unit 224 of the receiving circuit 220 to receive the external signal OUT_SIG includes a third PMOS transistor P26 and a fourth NMOS transistor N28. The third PMOS transistor P26 controls an amount of current flowing from a source-connected power supply voltage terminal VDD to a drain-connected driving node KND4 in response to a comparison signal COMP_VOL from the output node OUND4 of the differential amplifier 222. The fourth NMOS transistor N28 controls an amount of current flowing from a drain-connected driving node KND4 to a source-connected ground voltage terminal VSS in response to the comparison signal COMP_VOL from the output node OUND4 of the differential amplifier 222.

Since the external signal OUT_SIG applied to the receiving circuit 220 is a signal which is not known in its own signal type, the original value of the external signal OUT_SIG cannot be predicted while the external signal OUT_SIG is distorted or deformed through the signal transmission. It is not easy to determine an internal signal IN_SIG based on the external signal OUT_SIG in which the distortion or deformity is caused via the signal transmission.

Accordingly, in the present invention, the voltage level of the internal signal IN_SIG is determined with a relatively exact value, by determining the voltage level of the external signal OUT_SIG using the reference voltage VREF_IN outputted from the reference voltage generating unit 240.

That is, even if distortion and deformity are caused in the external signal OUT_SIG by a noise, the value of the internal signal IN_SIG exactly coincides with that of the external signal OUT_SIG because the logic level of the external signal OUT_SIG is determined based on the potential level of the reference voltage VREF_IN.

For example, in the case where the logic level of the external signal OUT_SIG is higher than that of the reference voltage VREF_IN, the logic level of the external signal OUT_SIG is determined as a logic high level and then the internal signal IN_SIG is produced based on such a logic high level of the external signal OUT_SIG. In the case where the logic level of the external signal OUT_SIG is lower than that of the reference voltage VREF_IN, the logic level of the external signal OUT_SIG is determined as a logic low level and then the internal signal IN_SIG is produced based on such a logic low level of the external signal OUT_SIG.

In the present invention, a dedicated pad for the reference voltage is not needed because the reference voltage VREF_IN is internally produced in the reference voltage generating unit 240 of the semiconductor device based on the positive clock signal CLK and the negative clock signal CLKb.

Therefore, the present invention can solve the problem of a complicated circuit design in which a plurality of pads to receive the reference voltage signals are to be provided. The present invention can reduce the development cost in highly integrated semiconductor modules.

When the signal receiving circuit to receive a signal from an external circuit is applied to a synchronous memory such as a SDRAM (Synchronous Dynamic Random Access Memory), a synchronization unit 260 can be further included in the signal receiving circuit. The synchronization unit 260 synchronizes the internal clock signal iCLK, which is output as a result of the receiving circuit 200 to receive the positive clock signal CLK and the negative clock signal CLKb, with the internal signal IN_SIG, which is output as a result of the receiving circuit 220 to receive the external signal OUT_SIG.

In the signal receiving circuit according to the present invention, the receiving circuit 200, which receives the positive clock signal CLK and the negative clock signal CLKb, and the receiving circuit 220, which receives the external signal OUT_SIG, are synchronized with each other regardless of the external environments of the semiconductor device due to the following features in construction thereof.

The first feature is characterized in that, in the receiving circuit 200 which receives the positive clock signal CLK and the negative clock signal CLKb, the positive and negative clock signals CLK and CLKb are respectively input into the positive and negative input terminals of the differential amplifier 202 for the differential amplification, at this time, the reference voltage VREF_IN is produced by dividing the voltage deference between the positive clock signal CLK and the negative clock signal CLKb in the reference voltage generating unit 240, and then the produced reference voltage VREF_IN is input into the positive input terminal of the differential amplifier 222 in the receiving circuit 220 which receives the external signal OUT_SIG.

That is, the first feature is characterized in that the potential level of the reference voltage VREF_IN can be associated with the potential levels of the positive and negative clock signals CLK and CLKb such that the fluctuation of the reference voltage VREF_IN is dependent upon the fluctuation of the positive and negative clock signals CLK and CLKb.

The second feature is characterized in that, in the receiving circuit 200 which receives the positive clock signal CLK and the negative clock signal CLKb, the third NMOS transistor N23 used as a bias transistor in the differential amplifier 202 is controlled by the potential level of the reference voltage VREF_IN produced by the reference voltage generating unit 240 and, in the receiving circuit 220 which receives the external signal OUT_SIG, the third NMOS transistor N27 used as a bias transistor in the differential amplifier 222 is also controlled by the potential level of the reference voltage VREF_IN produced by the reference voltage generating unit 240.

That is, the second feature is characterized in that both the differential amplifier 202 of the receiving circuit 200 which receives the positive clock signal CLK and the negative clock signal CLKb and the differential amplifier 222 of the receiving circuit 220 which receives the external signal OUT_SIG employ the reference voltage VREF_IN as a bias voltage.

The second feature also appears in the conventional signal receiving circuit of FIG. 1 when the enable signal ENABLE is used as a bias voltage of both the differential amplifier 102 in the receiving circuit 100 which receives the positive clock signal CLK and the negative clock signal CLKb and the differential amplifier 122 in the receiving circuit 120 which receives the external signal OUT_SIG.

Due to the above-mentioned features, the receiving circuit 200 which receives the positive clock signal CLK and the negative clock signal CLKb can be always synchronized with the receiving circuit 220 which receives the external signal OUT_SIG.

That is, when the maximum and minimum potential levels VILmax and VIHmin of the positive and negative clock signals CLK and CLKb are varied according to the external environments of the semiconductor device, the reference voltage VREF_IN from the reference voltage generating unit 240 is also varied based on such the variation. This means that the activation and inactivation sections of the internal signal IN_SIG which is produced by receiving the external signal OUT_SIG are varied based on the reference voltage VREF_IN and the amount of the variation is determined by the variation of the activation and inactivation sections of the internal clock signal iCLK which is produced by receiving the positive and negative clock signals CLK and CLKb.

As mentioned above, if the synchronization unit 260 operates with the internal clock signal iCLK and the internal signal IN_SIG which have the same variation, the characteristics of the set up and hold time are not changed.

For example, when the maximum and minimum potential levels VILmax and VIHmin of the positive and negative clock signals CLK and CLKb are generally increased, the receiving circuit 200 to receive the positive and negative clock signals CLK and CLKb produces the internal clock signal iCLK at a high speed more than usual. However, since the potential level of the reference voltage VREDF_IN is increased as the maximum and minimum potential levels VILmax and VIHmin of the positive and negative clock signals CLK and CLKb are generally increased, the operation speed of the receiving circuit 220 to receive the external signal OUT_SIG is increased and the internal signal IN_SIG is produced at a high speed more than usual.

If the synchronization of the internal clock signal iCLK and the internal signal IN_SIG, which are changed with the same timing, is carried out in the synchronization unit 260, the synchronized internal signal SYNC_IN_SIG is output with no change of the set up and hold time characteristics.

Therefore, the problem, which is caused by the change of the set up and hold time characteristics of the synchronized internal signal SYNC_IN_SIG, can be solved in the present invention.

As apparent from the above, according to the present invention, an additional pad for the reference voltage VREF_IN is not needed because the reference voltage VREF_IN is produced in the semiconductor device using the positive and negative clock signals CLK and CLKb, which are supplied from an external circuit and are out of phase with each other.

Therefore, the semiconductor design is not required to provide a plurality of pads for receiving the reference voltages VREF_IN so that the development cost can be reduced in highly integrated semiconductor modules.

Furthermore, since the potential level of the reference voltage VREF_IN is always synchronized with the potential level of the positive and negative clock signals CLK and CLKb in compliance with the operation environments of the semiconductor device, the external signal OUT_SIG can be more stably received.

As a result, the set up and hold time characteristics of the synchronized internal signal SYNC_IN_SIG, which is produced by a receiving operation of a signal, can be kept in a constant state and can cope with the variation of the operation environments of the semiconductor device.

While the present invention has been described with respect to the particular embodiments, it will be apparent to those skilled in the art that various changes and modifications may be made without departing from the spirit and scope of the invention as defined in the following claims.

For example, in the above-mentioned embodiment of the present invention, the described circuit receives the reference voltage VREF_IN which is produced by dividing the voltage difference between the positive and negative clock signals CLK and CLKb. However, the present invention can be applied to various circuits of the semiconductor devices in which the reference voltage VREF_IN produced by dividing the voltage difference between the positive and negative clock signals CLK and CLKb can be used to produce internal voltages of internal circuits. Furthermore, the logic gate and transistors can be modified according to the polarity and type of the signals.

What is claimed is:

1. A semiconductor device comprising:
 a clock receiving unit configured to receive positive and negative clock signals and output an internal clock signal based on the received positive and negative clock signals;
 a reference voltage generating unit configured to produce a reference voltage by dividing a voltage difference between the positive and negative clock signals;
 an input signal receiving unit configured to receive an external signal from an external circuit in response to the reference voltage; and
 a synchronization unit configured to synchronize an output signal of the input signal receiving unit with the internal clock signal.

2. The semiconductor device of claim 1, wherein the reference voltage generating unit includes series connected first and second resistors, and the reference voltage is output from a connection node between the first and second resistors.

3. The semiconductor device of claim 2, wherein the first and second resistors each have the same resistance.

4. The semiconductor device of claim 2, wherein the reference voltage generating unit further includes a capacitor connected between a reference voltage output terminal and a ground voltage terminal.

5. The semiconductor device of claim 1, wherein the clock receiving unit receives the positive and negative clock signals, the positive and negative clock signals swinging in a range of a CML (Common Mode Level) region, the internal clock signal swinging in a range of a CMOS region.

6. The semiconductor device of claim 1, wherein the clock receiving unit includes a differential amplifier, the differential amplifier connected to a power supply voltage and a ground voltage, and receiving the positive and negative clock signals as input signals.

7. The semiconductor device of claim 1, wherein the input signal receiving unit determines a logic level of the external signal based on a potential level of the reference voltage.

8. The semiconductor device of claim 7, wherein the input signal receiving unit determines that the external signal is in a logic low level when a potential level of the external signal is lower than a potential level of the reference voltage.

9. The semiconductor device of claim 7, wherein the input signal receiving unit determines that the external signal is in a logic high level when a potential level of the external signal is higher than a potential level of the reference voltage.

10. The semiconductor device of claim 1, wherein the external signal is a data signal.

11. The semiconductor device of claim 1, wherein the external signal is an address signal.

12. The semiconductor device of claim 1, wherein the external signal is a command signal.

* * * * *